(12) United States Patent
Liu et al.

(10) Patent No.: US 6,451,687 B1
(45) Date of Patent: Sep. 17, 2002

(54) INTERMETAL DIELECTRIC LAYER FOR INTEGRATED CIRCUITS

(75) Inventors: Huang Liu; John Sudijono; Juan Boon Tan; Edwin Goh; Alan Cuthbertson; Arthur Ang; Feng Chen; Qiong Li; Peter Chew, all of Singapore (SG)

(73) Assignees: Chartered Semiconductor Manufacturing Ltd., Singapore (SG); Lucent Technologies Inc., Allentown, PA (US)

( * ) Notice: Subject to any disclaimer, the term of this patent is extended or adjusted under 35 U.S.C. 154(b) by 0 days.

(21) Appl. No.: 09/721,898

(22) Filed: Nov. 24, 2000

(51) Int. Cl.[7] .......................................... H01L 21/4763
(52) U.S. Cl. ....................... 438/624; 438/631; 438/637; 438/787
(58) Field of Search ................. 438/624, 631, 438/637, 787

(56) References Cited

U.S. PATENT DOCUMENTS

| | | | |
|---|---|---|---|
| 5,937,323 A | 8/1999 | Orczyk et al. | 438/624 |
| 6,001,745 A * | 12/1999 | Tu et al. | 438/782 |
| 6,016,000 A | 1/2000 | Moslehi | 257/522 |
| 6,027,996 A | 2/2000 | Wu et al. | 438/624 |
| 6,057,251 A | 5/2000 | Goo et al. | 438/788 |
| 6,079,354 A | 6/2000 | Guo et al. | 118/719 |
| 6,096,634 A * | 8/2000 | Nguyen | 438/624 |
| 6,218,285 B1 * | 4/2001 | Lou | 438/624 |
| 6,284,644 B1 * | 9/2001 | Aug et al. | 438/623 |

* cited by examiner

Primary Examiner—T. N. Quach
(74) Attorney, Agent, or Firm—Mikio Ishimaru

(57) ABSTRACT

An intermetal dielectric structure for integrated circuits and a manufacturing method therefore is provided having a premetal dielectric and a metal line thereon, with a SRO liner on the premetal dielectric layer and the metal lines, a FGS dielectric layer over the SRO liner, a SRO film over the FGS dielectric layer, and a TEOS dielectric layer over the SRO film. Vias through the FGS dielectric layer are treated to have fluorine-free regions around the vias. The structure is not subject to fluorine attack on the metal lines or vias while having a stable FGS dielectric layer with less fluorine out-gassing and out-diffusion.

10 Claims, 4 Drawing Sheets

INTERMETAL DIELECTRIC LAYER FOR INTEGRATED CIRCUITS

TECHNICAL FIELD

The present invention relates generally to low dielectric constant materials used for the intermetal dielectric layer and more particularly to the use of fluorine containing low dielectric constant materials for intermetal dielectric layers for technologies of 0.18 μm and below.

BACKGROUND

The speed and reliability of semiconductor integrated circuits are coming to be more and more governed by the on-chip interconnects. Advanced chips employ multilevel on-chip interconnects usually comprising aluminum alloy lines, alluminum alloy or tungsten plugs for interlevel/intermetal contact/via holes, and fluorosilicate glass (fluorinated silicon dioxide, $SiO_xF_y$) as intermetal and interlevel dielectrics.

The speed performance of advanced chips, such as used for microprocessors and digital signal processors using sub-.18 μm complementary metal oxide semiconductor (CMOS) technologies and beyond is limited by the interconnect signal propagation delays. The signal propagation delay for advanced interconnects is limited by the parasitic resistive, capacitive, and inductive elements. These include the metal interconnect "RC" delays, capacitive noise or cross-talk, and inductive noise and cross-talk.

As chip dimensions are scaled down, the metal interconnect line widths and pitches are also scaled down accordingly. This means that the intermetal/interlevel dielectric layers (IMD and ILD layers) must be thinner. To reduce capacitive effects with the IMD/ILD materials, low dielectric constant (low-k) dielectric materials have been developed which have k values in the range of 3.2 down to 2.0. However, these low-k dielectrics complicate the backend of line (BEOL) process because of their inferior thermal stability as well as their electrical, mechanical, and thermal conductivity properties compared to conventionally used silicon oxide ($SiO_x$).

High-density plasma (HDP) deposited fluorinated silica glass (FSG) intermetal dielectric (IMD) films have been of high interest for submicron devices due to its low dielectric constant (k) and good gap-filling capability. However HDP FSG has several problems from a process integration aspect, such as fluorine out-gassing, fluorine attack on conductors, etc. Fluorine out-gassing will cause voids in the vias which can lead to open vias. Fluorine attack on conductors during FSG deposition will clip away the corners of metal lines to leave metal lines having "pear" shaped cross-sections. Fluorine attack on conductors after FSG deposition due to the fluorine out-diffusion under thermal stress will lead to conductor fluoride in the metal line which will cause the critical dimension (CD) of the metal line to be lower than specified.

To prevent problems with HDP FSG, one attempt has been to use a very thick FSG film followed by a chemical-mechanical polishing (CMP) of the FSG to more than half its thickness and then capping with a silicon rich oxide (SRO) layer. This approach can reduce fluorine out-diffusion, but cannot totally eliminate it, and fluorine out-gassing into the vias and the "pear" shaped metal line problems still occur. At the same time, this method also creates some other problems like lithography CD control variation due to the impact from the SRO unmasking. The use of thick FSG films also leads to low throughput of the FSG process and high cost of ownership (COO). The FSG CMP integration is also a problem.

A solution to the above problems has been long sought, but has long eluded those skilled in the art.

DISCLOSURE OF THE INVENTION

The present invention provides an intermetal dielectric structure for integrated circuits and a manufacturing method therefore having a premetal dielectric and a metal line thereon with a halogen-barrier liner on the premetal dielectric layer and the metal lines, a halogen-containing dielectric layer over the halogen-barrier liner, a halogen-barrier film over the halogen-containing dielectric layer, and a non-halogen-containing dielectric layer over the halogen-barrier film. The structure is not subject to halogen attack on the metal lines while having a stable halogen containing dielectric layer with less halogen out-gassing and out-diffusion in a simplified integration flow with reduced process cycle time.

The present invention provides an intermetal dielectric structure for integrated circuits and a manufacturing method therefore having a premetal dielectric and a metal line thereon, with a halogen-barrier liner on the premetal dielectric layer and the metal lines, a halogen-containing dielectric layer over the halogen-barrier liner, a halogen-barrier film over the halogen-containing dielectric layer, and a non-halogen-containing dielectric layer over the halogen-barrier film. Vias through the halogen-containing dielectric layer are treated to have non-halogen-containing regions around the vias. The structure is not subject to halogen attack on the metal lines or vias while having a stable halogen containing dielectric layer with less halogen out-gassing and out-diffusion in a simplified integration flow with reduced process cycle time.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
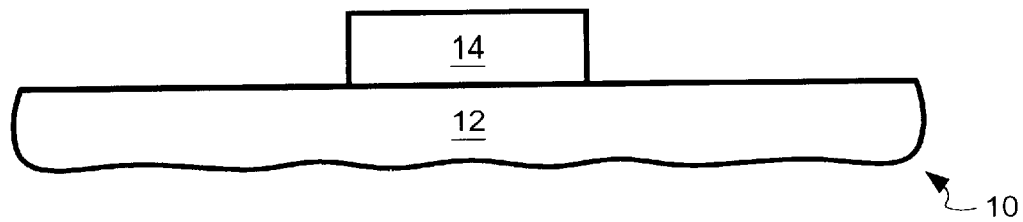
FIG. 1 is a view of an intermetal dielectric structure of a premetal dielectric with a metal line thereon.

Referring now to FIG. 1, therein is shown the initial structure of an intermetal dielectric (IMD) structure 10 of a semiconductor substrate or premetal dielectric (PMD) layer 12 having a metal line 14, generally of aluminum or an aluminum alloy, formed thereon. The IMD 10 is a portion of an integrated circuit interconnect for connecting various components of an integrated circuit. The PMD layer 12 separates the components which are on and in a semiconductor substrate from subsequent layers which contain the metal lines. The components are connected by contacts (not shown) to the bottom of the metal lines at different locations.

Figure 2:
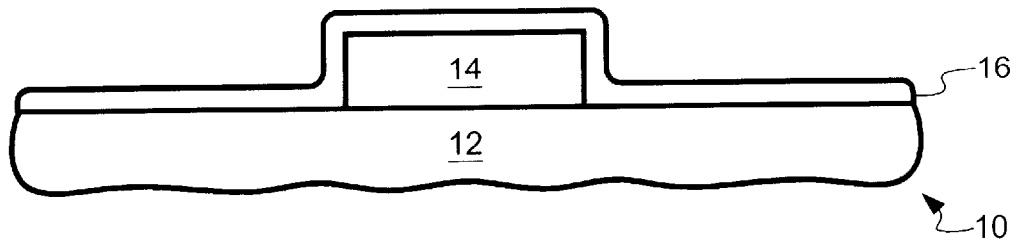
FIG. 2 is the structure of FIG. 1 having a silicon-rich oxide liner over the premetal dielectric and the metal line.

Referring now to FIG. 2, therein is shown a silicon-rich oxide (SRO) liner 16 deposited over the PMD 12 and the metal line 14. The SRO liner 16 is deposited by high-density plasma (HDP) deposition, in situ with zero bias, in a silane ($SiH_4$)-oxygen ($O_2$) ambient in which the ratio of silane to oxygen is 0.8 to 1.2:1. The refractive index (RI) is maintained between 1.48 and 1.54 (normal oxide layers have RIs between 1.45 to 1.46). In the best mode, the SRO liner 16 is deposited to a thickness between 200 to 600Å.

It should be noted that the SRO layer 16 prevents fluorine attack on the conductor material during the FSG deposition which previously caused the corners of the metal lines to be clipped away so as to form a pear-shaped cross-section metal lines rather than the rectangular cross-section metal lines in the present invention.

Figure 3:
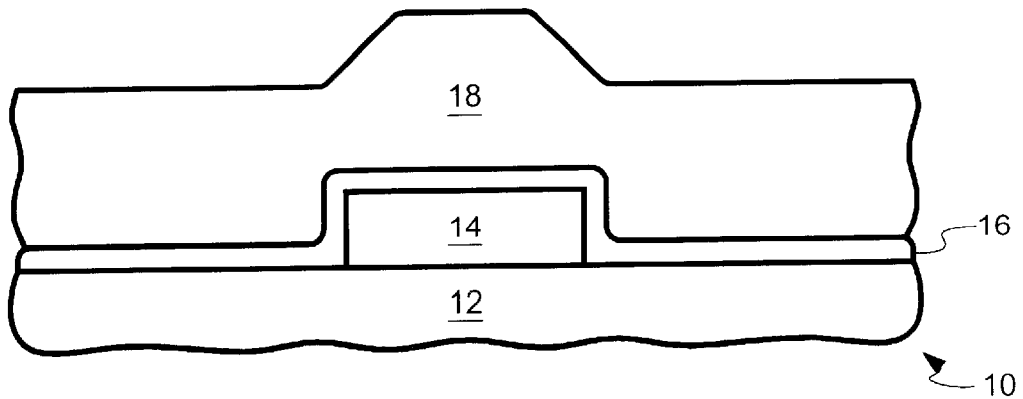
FIG. 3 is the structure of FIG. 2 having a fluorosilicate glass layer.

Referring now to FIG. 3, therein is shown the structure of FIG. 2 having a flurosilicate glass (FSG) layer 18. The FSG layer 18 is deposited by HDP deposition with the temperature controlled in the range from 410° C.–430° C. It has been determined that this temperature range stabalizes the FSG layer 18 and helps to reduce fluorine out-gassing and out-diffusion. In the best mode, the thickness of the FSG layer 18 plus the SRO liner 16 will equal the height of the metal line 14 plus the depth of the oxide over-etch so as to reduce the intra-metal capacitance and control the cost of ownership (COO) of FSG deposition at a low level.

Figure 4:
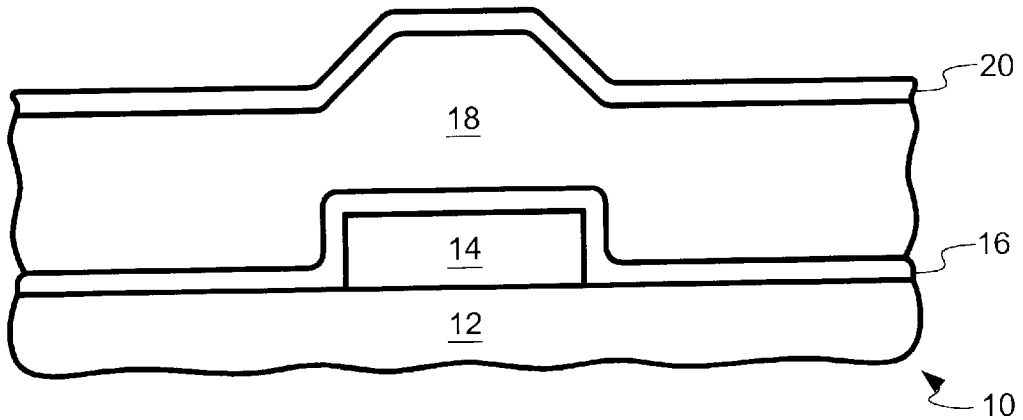
FIG. 4 is the structure of FIG. 3 with an in situ silicon-rich oxide film over the fluorosilicate glass layer.

Referring now to FIG. 4, therein is shown the structure of FIG. 3 with an in situ SRO film 20 deposited over the FSG layer 18. The in situ SRO film 20 is deposited by HDP deposition using the same bias power as for the FSG layer 18. The HDP deposition is carried out in a silane-oxygen ambient with a silane to oxygen ratio of 0.70 to 1.0:1. The RI is controlled from 1.48–1.54 and the stress is close to that of the FSG layer 18. In the best mode, the in situ SRO film 20 is deposited to a thickness between 0.5–2 kÅ. The in situ SRO film 20 is deposited immediately after the deposition of the FSG layer 18 so as to eliminate exposure to the ambient to reduce moisture absorption and block fluorine out-diffusion. Using in situ SRO instead of ex-situ plasma enhanced chemical vapor deposition (PECVD) SRO also simplifies the integration flow and helps to reduce the process cycle time.

Figure 5:
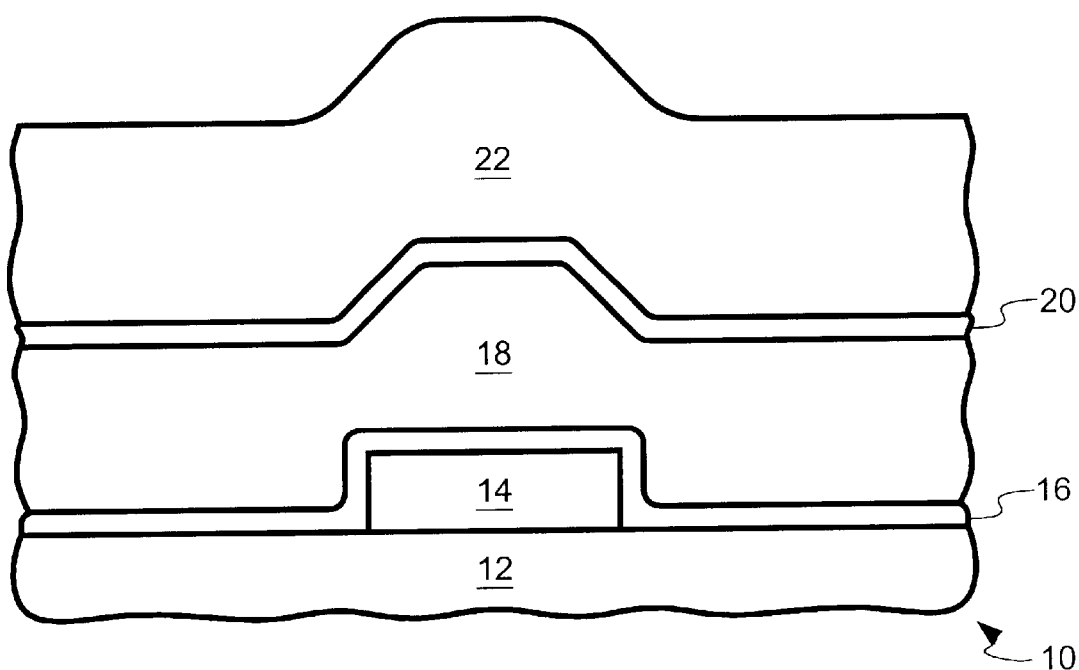
FIG. 5 is the structure of FIG. 4 with a tetraethoxysilane layer.

Referring now to FIG. 5, therein is shown the structure of FIG. 4 after deposition of a tetraethoxysilane (TEOS) layer 22.

Figure 6:
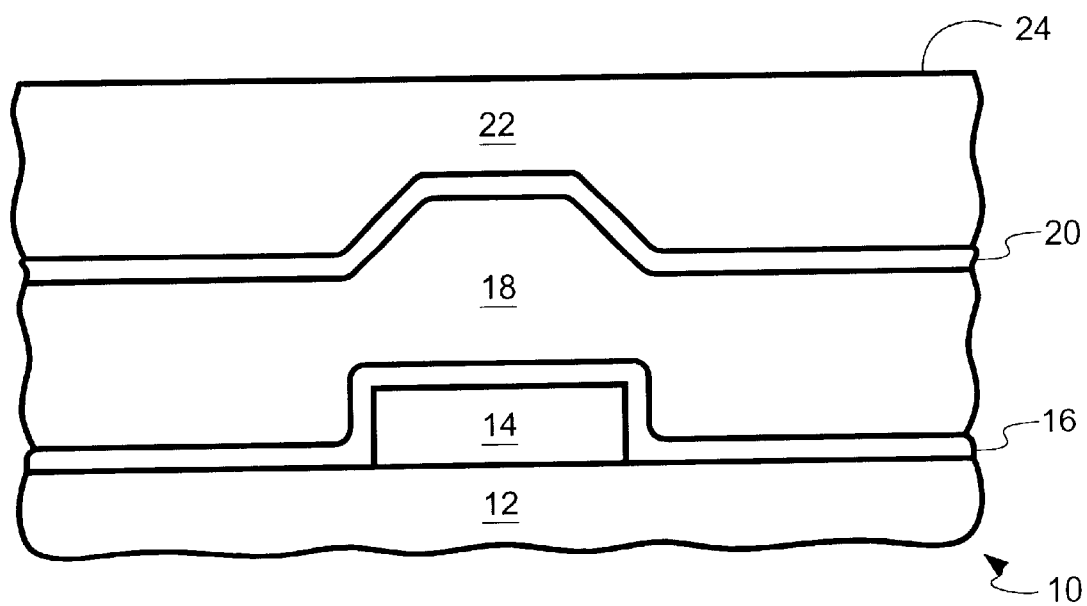
FIG. 6 is the structure of FIG. 5 after planarization of the tetraethoxysilane layer to form the intermetal dielectric structure in accordance with the present invention.

Referring now to FIG. 6, therein is shown the structure of FIG. 5 after chemical-mechanical polishing (CMP) which forms a planar surface 24 on the TEOS layer 22. This structure of FIG. 6 manufactured in accordance with the present invention has advantages independent of the structure which includes the via as will hereinafter be described.

Figure 7:
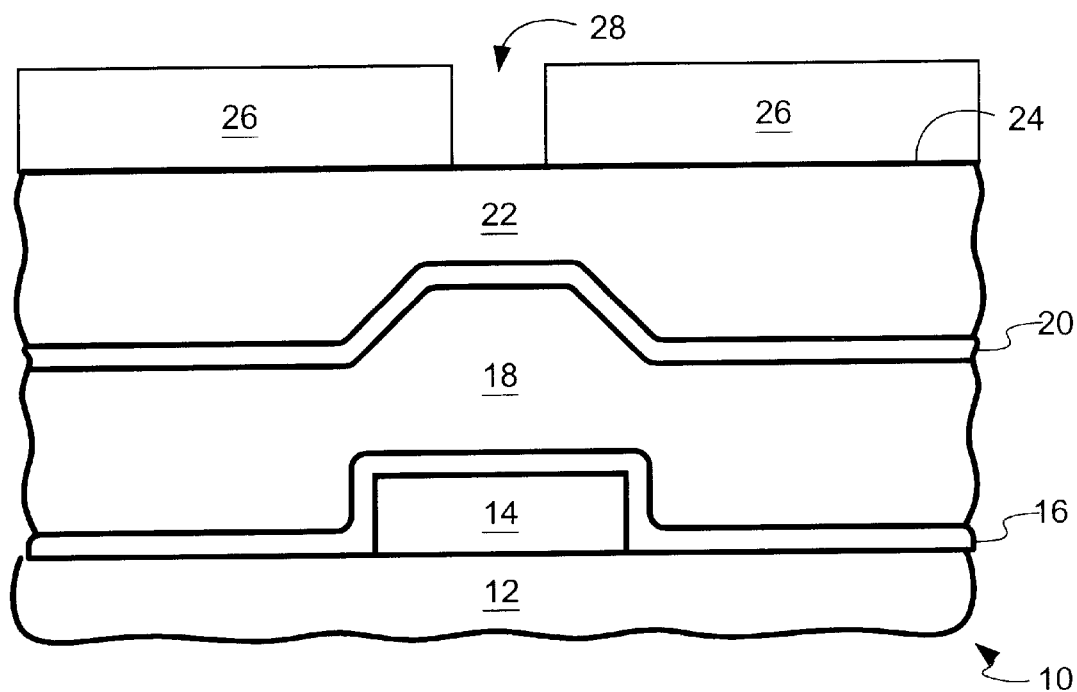
FIG. 7 is the structure of FIG. 6 with a photoresist on the planar surface and a via opening.

Referring now to FIG. 7, therein is shown the structure of FIG. 6 having a photoresist 26 deposited on the planar surface 24, patterned, developed, and etched to form a via opening 28 in the photoresist 26.

Figure 8:
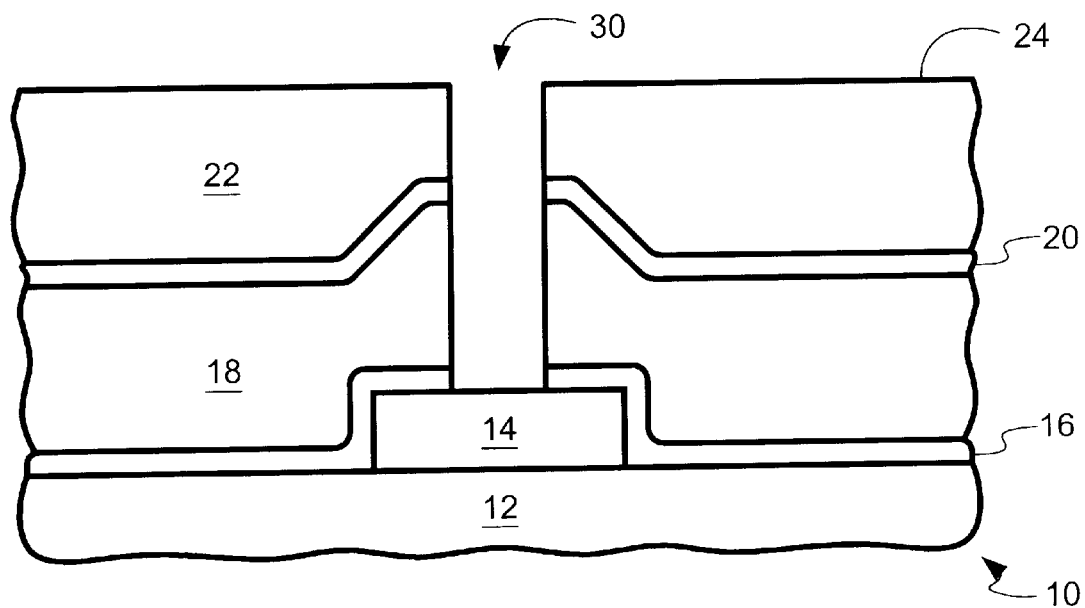
FIG. 8 is the structure of FIG. 7 after etching the via opening and stripping the photoresist.

Referring now to FIG. 8, therein is shown the structure of FIG. 7 after etching of the via opening 30 in the TEOS layer 22, the SRO film 20, the FSG layer 18, and the SRO liner 16, and after removal of the photoresist 26.

Figure 9:
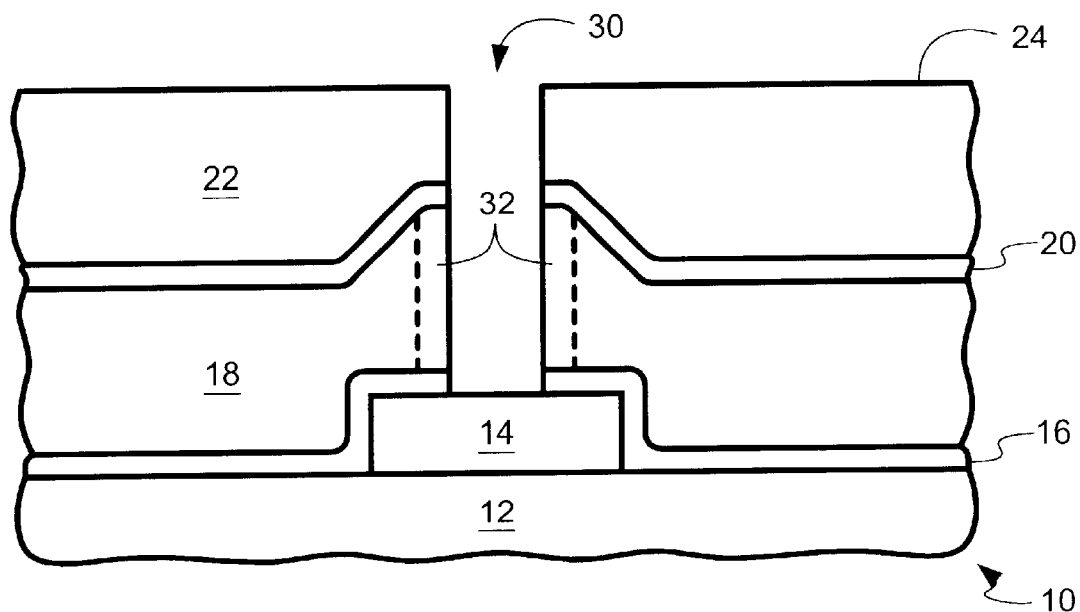
FIG. 9 is the structure of FIG. 8 after post-plasma treatment with an ammonianitrogen gas mixture.

Referring now to FIG. 9, therein is shown the structure of FIG. 8 after post-plasma treatment with an ammonia ($NH_3$)-nitrogen ($N_2$) gas mixture. This post-plasma treatment results in a fluorine-depleted region 32 in the FSG layer 18 around the via opening 30. The fluorine-depleted region 32 is preferably under 160 A in thickness.

Figure 10:
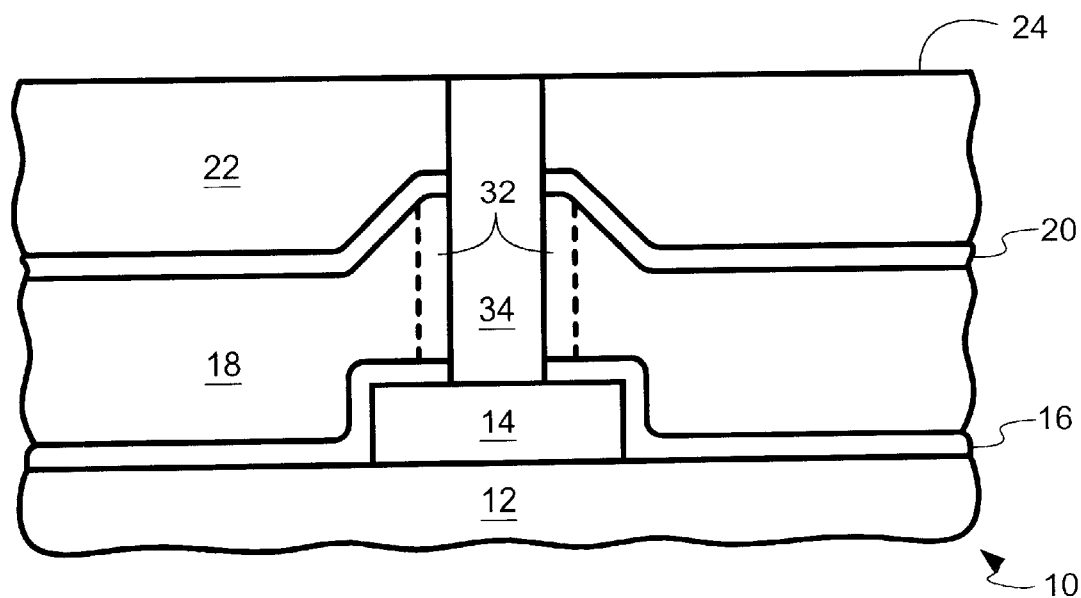
FIG. 10 is the structure of FIG. 9 after deposition of the via in accordance with the present invention.

Referring now to FIG. 10, therein is shown the structure of FIG. 9 after deposition of the via 34. The fluorine-depleted region 32 protects subsequently deposited metal of the via 34 against fluorine attack. The via 34 is of a metal such as aluminum or aluminum alloyed with copper.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method for manufacturing an intermetal dielectric structure for an integrated circuit comprising:
   providing a premetal dielectric layer having a metal line thereon;
   depositing a halogen-barrier liner on the premetal dielectric layer and the metal line,
   depositing a halogen-containing dielectric layer over the halogen-barrier liner;
   depositing a halogen-barrier film over the halogen-containing dielectric layer, and
   deposting a non-halogen-containing dielectric layer over the halogen-barrier film.

2. The method for manufacturing an intermetal dielectric structure as claimed in claim 1 wherein depositing the halogen-barrier liner uses a silicon-rich oxide.

3. The method for manufacturing an intermetal dielectric structure as claimed in claim 1 wherein depositing the halogen-containing dielectric layer uses a fluorosilicate glass.

4. The method for manufacturing an intermetal dielectric structure as claimed in claim 1 wherein depositing the halogen-barrier film uses a silicon-rich oxide film.

5. The method for manufacturing an intermetal dielectric structure as claimed in claim 1 including:
   depositing and patterning a via photoresist;
   developing the via photoresist having via openings provided therein;
   etching the non-halogen-containing dielectric layer, the halogen barrier film, the halogen-containing dielectric layer, and the halogen-barrier liner using the via photoresist opening to form a via opening to the metal line; and
   forming a halogen-depleted region in the balogen-containing dielectric layer proximate the via opening provided therein.

6. A method for manufacturing an intermetal dielectric structure for an integrated circuit comprising:
   providing a premetal dielectric layer having a metal line thereon;
   depositing a fluorine barrier layer on the premetal dielectric layer and the metal line;
   depositing a fluorine-containing dielectric layer over the fluorine barrier liner;
   depositing a fluorine barrier film over the fluorine-containing dielectric layer; and depositing a non-fluorine-containing dielectric layer over the fluorine barrier film.

7. The method for manufacturing an intermetal dielectric structure as claimed in claim 6 wherein depositing the fluorine barrier liner uses a silicon-rich oxide deposited by high-density plasma deposition in situ with zero bias in a silane-oxygen ambient in which the ratio of silane to oxygen is from 0.8 to 1.2:1.

8. The method for manufacturing an intermetal dielectric structure as claimed in claim 6 wherein depositing the fluorine-containing dielectric layer uses a fluorosilicate glass by high-density plasma deposition at a temperature in the range from 410° C. to 430° C.

9. The method for manufacturing an intermetal dielectric structure as claimed in claim 6 wherein depositing the fluorine barrier film uses a silicon-rich oxide film by high-density plasma deposition in situ.

10. The method for manufacturing an intermetal dielectric structure as claimed in claim 6 including:

depositing and patterning a via photoresist;

developing the via photoresist having via openings provided therein;

etching the non-fluorine-containing dielectric layer, the fluorine barrier film, the fluorine-containing dielectric layer, and the fluorine barrier liner using the via photoresist opening to form a via opening to the metal line; and forming a fluorine-depleted region in the fluorine-containing dielectric layer proximate the via opening provided therein by an ammonia-nitrogen gas mixture treatment.

* * * * *

UNITED STATES PATENT AND TRADEMARK OFFICE
CERTIFICATE OF CORRECTION

PATENT NO. : 6,451,687 B1
DATED : September 17, 2002
INVENTOR(S) : Liu et al.

It is certified that error appears in the above-identified patent and that said Letters Patent is hereby corrected as shown below:

Column 1,
Line 50, delete "comers" and insert therefor -- corners --

Column 4,
Line 28, delete "line," and insert therefor -- line; --
Line 32, delete "layer," and insert therefor -- layer; --
Line 55, delete "balogen" and insert therefor -- hologen --

Signed and Sealed this

Twenty-fifth Day of February, 2003

JAMES E. ROGAN
*Director of the United States Patent and Trademark Office*